(12) United States Patent
Seet et al.

(10) Patent No.: US 11,338,393 B2
(45) Date of Patent: May 24, 2022

(54) MANUFACTURING METHOD OF PROCESSED RESIN SUBSTRATE AND LASER PROCESSING APPARATUS

(71) Applicants: Laser Systems Inc., Hokkaido (JP); NICHIA CORPORATION, Tokushima (JP)

(72) Inventors: Kock Khuen Seet, Hokkaido (JP); Masayuki Hayashida, Tokushima (JP); Masakazu Sakamoto, Tokushima (JP); Hiroto Tamaki, Anan (JP)

(73) Assignees: LASER SYSTEMS INC., Hokkaido (JP); NICHIA CORPORATION, Tokushima (JP)

( * ) Notice: Subject to any disclaimer, the term of this patent is extended or adjusted under 35 U.S.C. 154(b) by 374 days.

(21) Appl. No.: 15/337,513

(22) Filed: Oct. 28, 2016

(65) Prior Publication Data
US 2017/0120390 A1    May 4, 2017

(30) Foreign Application Priority Data
Oct. 30, 2015 (JP) .............................. JP2015-214787

(51) Int. Cl.
*B23K 26/382* (2014.01)
*H05K 3/00* (2006.01)
(Continued)

(52) U.S. Cl.
CPC ........ *B23K 26/382* (2015.10); *B23K 26/0622* (2015.10); *B23K 26/082* (2015.10);
(Continued)

(58) Field of Classification Search
CPC ...... B23K 26/00; B23K 26/40; B23K 26/082; B23K 26/50; B23K 26/402; B23K 26/0622; B23K 26/382; B23K 26/18; B23K 2103/12; B23K 2103/10; B23K 2103/42; H05K 3/0035; H05K 2203/0554; H05K 2201/09127
See application file for complete search history.

(56) References Cited

U.S. PATENT DOCUMENTS 4,504,727 A * 3/1985 Melcher ................. B23K 26/03
219/121.62
5,483,100 A * 1/1996 Marrs ............... H01L 23/49827
257/700

(Continued)

FOREIGN PATENT DOCUMENTS

JP    09-168877 A    6/1997
JP    2000-244076 A    9/2000
(Continued)

*Primary Examiner* — Jacob T Minskey
*Assistant Examiner* — Caroline Beha
(74) *Attorney, Agent, or Firm* — Brundidge & Stanger, P.C.

(57) ABSTRACT

A manufacturing method of a processed resin substrate includes: preparing a resin substrate including a resin layer and a metal layer that covers at least a part of one surface of the resin layer; and forming a through hole in the resin substrate by irradiating the resin substrate with pulsed laser light. In the forming of the through hole, an interval of irradiation of the pulsed laser light at each point on the resin substrate is 5 msec or more.

12 Claims, 8 Drawing Sheets

(51) Int. Cl.
   *B23K 26/0622* (2014.01)
   *B23K 26/082* (2014.01)
   *B23K 103/00* (2006.01)
   *B23K 26/18* (2006.01)
   *B23K 26/402* (2014.01)
   *B23K 103/10* (2006.01)
   *B23K 103/12* (2006.01)

(52) U.S. Cl.
   CPC ............ *B23K 26/18* (2013.01); *B23K 26/402* (2013.01); *H05K 3/0035* (2013.01); *B23K 2103/10* (2018.08); *B23K 2103/12* (2018.08); *B23K 2103/42* (2018.08); *H05K 2201/09127* (2013.01); *H05K 2203/0554* (2013.01)

(56) References Cited

U.S. PATENT DOCUMENTS

| | | | | |
|---|---|---|---|---|
| 5,548,890 | A | * | 8/1996 | Tada .................. H01L 21/4821 216/14 |
| 5,593,606 | A | * | 1/1997 | Owen .................. C23C 14/046 219/121.71 |
| 5,841,102 | A | * | 11/1998 | Noddin ................ H01L 21/486 219/121.71 |
| 6,037,103 | A | * | 3/2000 | Hino .................... H01L 21/486 219/121.71 |
| 7,605,343 | B2 | * | 10/2009 | Lei ...................... H05K 3/0035 219/121.71 |
| RE43,400 | E | * | 5/2012 | O'Brien ............... B23K 26/032 264/400 |
| 2001/0045419 | A1 | * | 11/2001 | Dunsky ................ B23K 26/02 219/121.76 |
| 2002/0033387 | A1 | * | 3/2002 | Kurosawa ............ H05K 3/0032 219/121.72 |
| 2006/0027544 | A1 | * | 2/2006 | Pailthorp ............. B23K 26/389 219/121.71 |
| 2006/0169677 | A1 | * | 8/2006 | Deshi .................. H05K 3/0035 219/121.7 |
| 2007/0272667 | A1 | * | 11/2007 | Lei ...................... B23K 26/0624 219/121.71 |
| 2009/0178839 | A1 | | 7/2009 | Takenaka et al. |
| 2010/0197116 | A1 | * | 8/2010 | Shah .................... B23K 26/38 438/463 |
| 2014/0182917 | A1 | | 7/2014 | Mikado et al. |
| 2014/0295803 | A1 | | 10/2014 | Kobayashi |

FOREIGN PATENT DOCUMENTS

| | | | | |
|---|---|---|---|---|
| JP | 3202977 | B2 | | 8/2001 |
| JP | 2003-110218 | A | | 4/2003 |
| JP | 2005-186110 | A | | 7/2005 |
| JP | 2005-223174 | A | | 8/2005 |
| JP | 2005-303322 | A | | 10/2005 |
| JP | 2006-026665 | A | | 2/2006 |
| JP | 2006026665 | A | * | 2/2006 |
| JP | 2006-205261 | A | | 8/2006 |
| JP | 2009166103 | A | * | 7/2009 ............. B41J 2/162 |
| JP | 4781634 | B2 | | 9/2011 |
| JP | 4781635 | B2 | | 9/2011 |
| JP | 4854059 | B2 | | 1/2012 |
| JP | 2012-061480 | A | | 3/2012 |
| JP | 2012-164999 | A | | 8/2012 |
| JP | 2014-130962 | A | | 7/2014 |
| JP | 2014-202517 | A | | 10/2014 |
| WO | 2008/111309 | A1 | | 9/2008 |
| WO | 2011/128929 | A1 | | 10/2011 |
| WO | 2012/029123 | A1 | | 3/2012 |

* cited by examiner

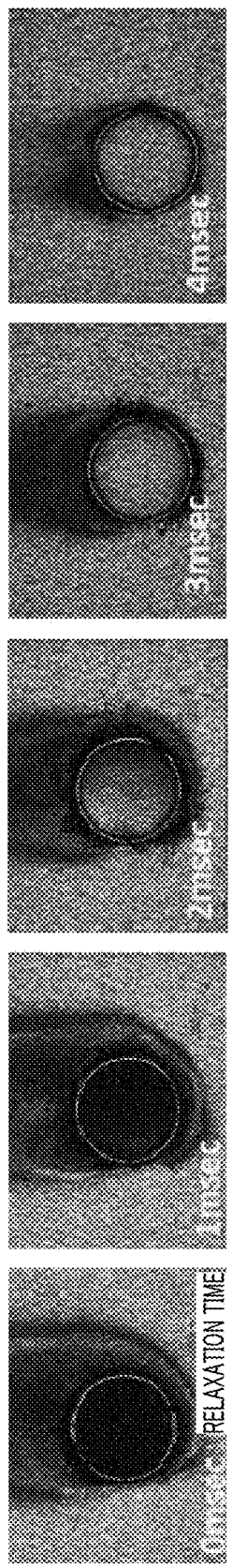
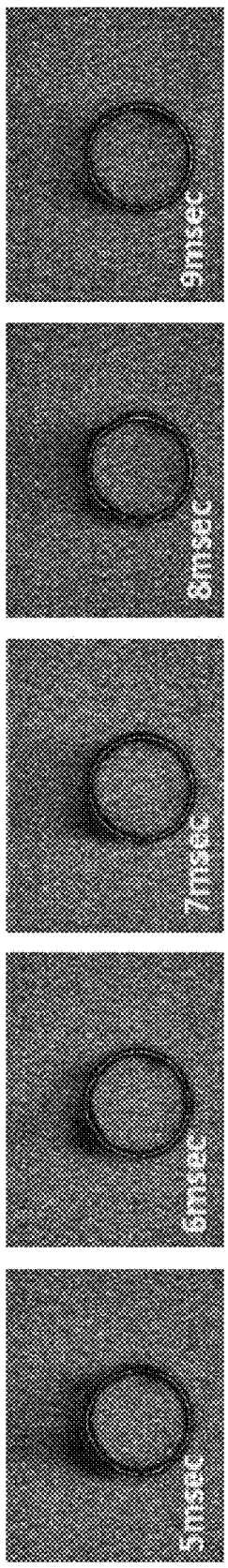
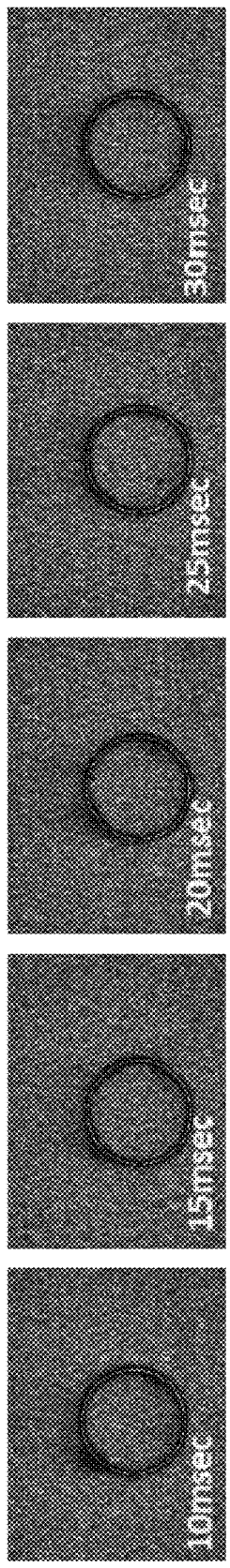

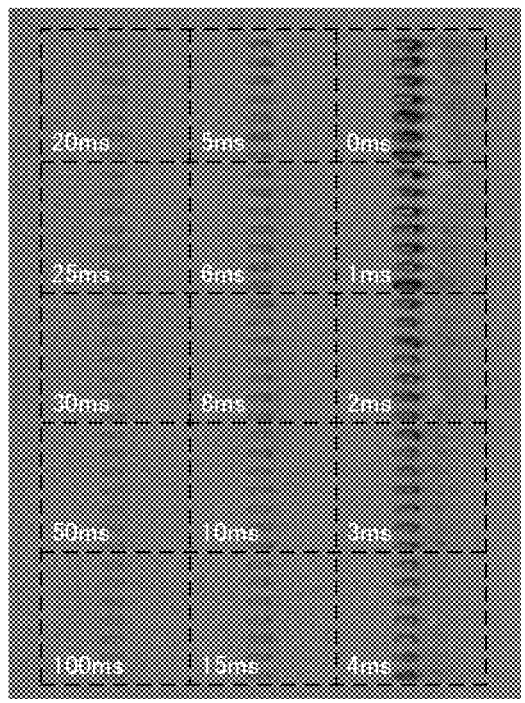 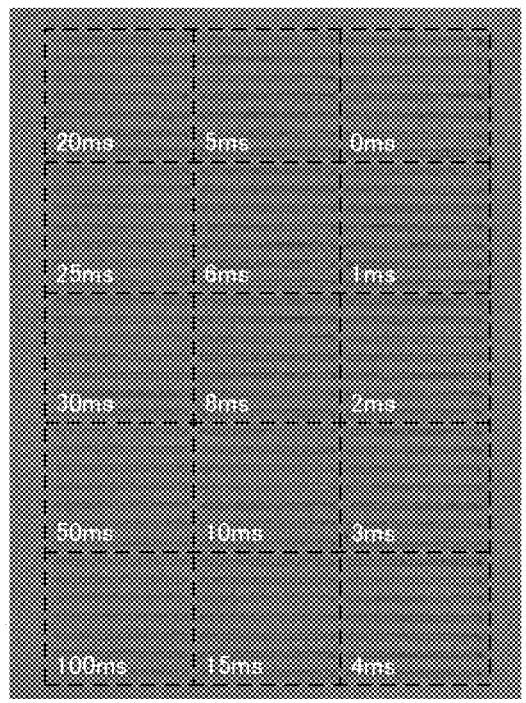
FIG. 5A                    FIG. 5B

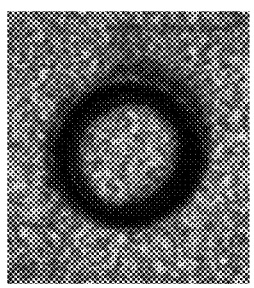 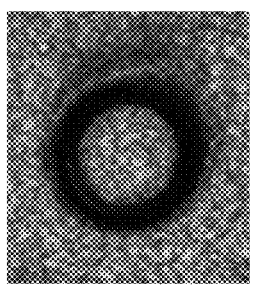 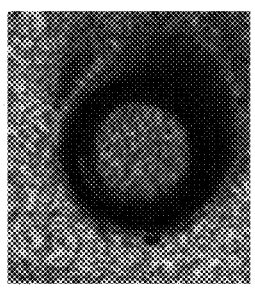 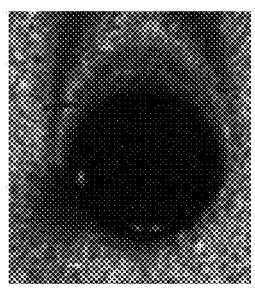
FIG. 7A          FIG. 7B          FIG. 7C          FIG. 7D
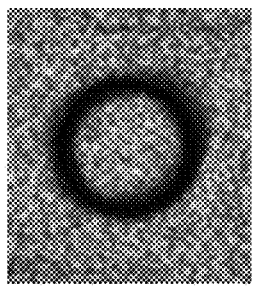 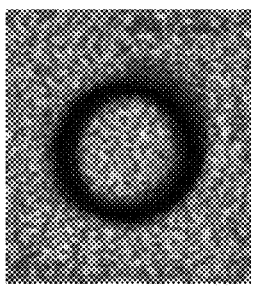 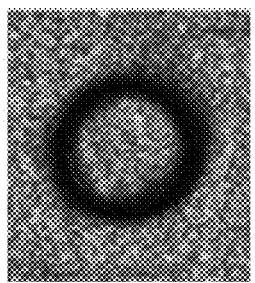 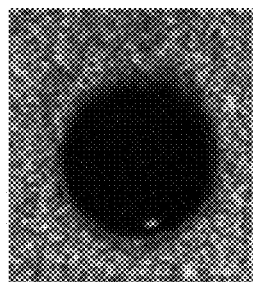
FIG. 7E          FIG. 7F          FIG. 7G          FIG. 7H

MANUFACTURING METHOD OF PROCESSED RESIN SUBSTRATE AND LASER PROCESSING APPARATUS

CROSS REFERENCE TO RELATED APPLICATIONS

This application is entitled to and claims the benefit of Japanese Patent Application No. 2015-214787, filed on Oct. 30, 2015, the disclosure of which including the specification, drawings and abstract is incorporated herein by reference in its entirety.

BACKGROUND

Technical Field

The present invention relates to a manufacturing method of a processed resin substrate and a laser processing apparatus.

Description of Related Art

In the field of printed substrates such as a glass epoxy substrate, resins such as epoxy resin and polyimide are often used as the insulating material. In a printed substrate having such a resin layer, a plurality of through holes are provided for various purposes. Conventionally, through holes have been formed by machine processing using drills, rooters, and the like. In recent years, through holes are formed by laser processing in some situation.

For example, Japanese Patent Application Laid-Open No. 2012-61480 discloses a method for forming a through hole by irradiating a flexible printed substrate including a polyimide resin layer having a thickness of 25 μm with pulsed laser light having a wavelength equal to or greater than 400 nm and smaller than 9 μm. In this method, a through hole is formed by performing scanning with pulsed laser light in multiple rounds along an annular path or a spiral path corresponding to a predetermined outer edge line of the through hole.

SUMMARY

According to one aspect of the present invention relates to a manufacturing method of a processed resin substrate including: preparing a resin substrate including a resin layer and a metal layer that covers at least a part of one surface of the resin layer; and forming a through hole in the resin substrate by irradiating the resin substrate with pulsed laser light. In the forming of the through hole, an interval of irradiation of the pulsed laser light at each point on the resin substrate is 5 msec or more.

Further, according to another aspect of the present invention relates to a laser processing apparatus that irradiates a resin substrate with pulsed laser light to form a through hole, the laser processing apparatus including: a laser light source that emits pulsed laser light; a stage on which to place a resin substrate including a resin layer and a metal layer that covers at least a part of one surface of the resin layer; an optical system that guides the pulsed laser light emitted from the laser light source to the resin substrate placed on the stage; a scanning section that moves at least one of the stage and a condensing point of the pulsed laser light guided by the optical system to relatively move the resin substrate placed on the stage and the condensing point of the pulsed laser light; and a control section that controls an operation of the scanning section. The control section controls the scanning section such that the pulsed laser light is applied in multiple rounds along a predetermined outer edge line of the through hole, and that an interval of irradiation at each point on the predetermined outer edge line between each round is 5 msec or more.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

FIG. 4A to FIG. 4Q are photographs of surfaces of substrates showing experiment results of Example 2;

FIG. 5A and FIG. 5B are photographs of surfaces of substrates showing experiment results of Example 3;

FIG. 7A to FIG. 7H are photographs of surfaces of substrates showing experiment results of Example 4.

DESCRIPTION OF EMBODIMENT

Figure 1A:
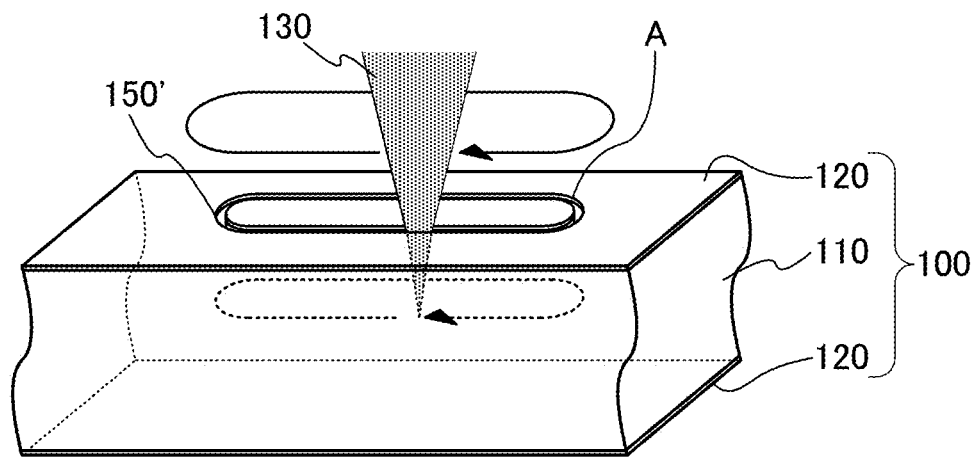
FIG. 1A to FIG. 1C are schematic views for describing steps for forming a through hole in a resin substrate with a laser processing method according to an embodiment of the present invention.

The embodiments will now be described with reference to the accompanying drawings, wherein like reference numerals designate corresponding or identical elements throughout the various drawings.

1. Manufacturing Method of Processed Resin Substrate

A manufacturing method of a processed resin substrate according to the present embodiment is a method for obtaining a processed resin substrate by forming a through hole by laser processing in a resin substrate including a resin layer and a metal layer that covers at least a part of one surface of the resin layer. Here, the term "resin substrate" means a resin substrate before laser processing, and the term "processed resin substrate" means a resin substrate after laser processing. While the name of a resin substrate is different between before and after the laser processing, the physical property, the composition and the like of the resin substrate are not significantly different between before and after the laser processing.

In addition, "through hole" (broader concept) that is formed by the manufacturing method of a processed resin substrate according to the present embodiment includes a dotted "through hole" (narrower concept) which is formed without performing laser light scanning, and an "opening" which is formed by laser light scanning. Further, the "opening" includes "hole having a shape substantially identical to a scanning line" which is formed by scanning with laser light in a linear and/or a curved manner, and "hole having a shape substantially identical to a given region" which is formed by scanning with pulsed laser light enclosing the given region.

The manufacturing method of a processed resin substrate according to the present embodiment includes a first step of preparing a resin substrate, and a second step of forming a through hole by irradiating the resin substrate with pulsed laser light. The steps will be described below.

(First Step)

In the first step, as a processing object, a resin substrate including a resin layer and a metal layer that covers at least a part of one surface of the resin layer is prepared. The resin substrate may be prepared by buying a commercially available product, or by producing a resin substrate. The resin substrate is, but not limited to, a rigid printed circuit substrate, for example.

The type of the resin of the resin layer is not limited. Examples of the resin of the resin layer include epoxy resin, polyimide resin, polyethylene terephthalate resin, polyethylene naphthalate resin, bismaleimide triazine resin, phenol resin, silicone resin, modified silicone resin, epoxy modified silicone resin, polyphenylene ether resin, liquid crystal polymer resin and combinations thereof.

In addition, the resin layer may include a reinforcement for improving the strength, or may not include a reinforcement. Examples of the reinforcement include a glass fiber, ceramics, a ceramics fiber, paper, cloth, a carbon fiber, an aramid fiber and combinations thereof. Examples of the resin layer include a glass epoxy substrate and a polycarbonate substrate. The thickness of the resin layer is, but not limited to, 200 to 500 µm, for example.

The metal layer covers at least a part of one surface of the resin layer. To be more specific, the metal layer covers at least one surface of the resin layer of at least a part where the through hole is formed. The metal layer has a high thermal conductivity, and therefore has a function of effectively dissipating the excessive thermal energy accumulated in a region around the surface of the resin layer during the processing. In addition, the metal layer has a function of blocking transmission of oxygen into the resin layer from the outside. By the synergistic effect of the above-mentioned functions, the metal layer suppresses undesirable thermal damages such as burning and digging during the processing. In view of the foregoing, preferably, the metal layer covers the both surfaces of the resin layer, or more preferably, the metal layer covers the both surfaces of the resin layer in whole. In addition, one or more metal layers may be provided.

The type of the metal of the metal layer is not limited. Preferably, the metal of the metal layer has high thermal conductivity from the viewpoint of suppressing undesirable thermal damage in the second step. Examples of the metal of the metal layer include one or more metals selected from the group consisting of copper, silver, gold and aluminum, and alloys which contain the above-mentioned metals as the main component. The metal layer can be formed by sputtering, vapor deposition, plating and the like.

The thickness of the metal layer is, but not limited to, 2 to 50 µm, for example. The metal layer may be a thin layer such as a metal foil. As described above, the metal layer may cover the both surfaces of the resin layer, or two or more metal layers may be disposed on one surface of the resin layer. With such configurations, the thickness of each metal layer can be reduced. On the other hand, in the case where one metal layer is disposed on only one surface of the resin layer, it is necessary to increase the thickness of the metal layer to a certain degree from the viewpoint of suppressing thermal damage of the resin layer.

In addition, another metal layer intended for improvement of bonding force, prevention of migration and the like may be disposed between the resin layer and the metal layer for the heat transmission. Examples of such a metal layer include a Ni layer, a Cr layer, and a NiCr alloy layer having a thickness of about hundreds of nanometers, and the like.

(Second Step)

In the second step, a portion of the resin substrate whose at least one surface is covered with the metal layer prepared in the first step is irradiated with pulsed laser light to form a through hole. For example, in the case where an opening is formed as a through hole (broader concept), the through hole (opening) is formed by repeating, in multiple rounds, the scanning with pulsed laser light along a predetermined outer edge line of the opening to be formed. At this time, preferably, the scanning with the pulsed laser light is performed in multiple rounds. In addition, preferably, the pulsed laser light is applied to the resin substrate from the side on which the metal layer is disposed from the viewpoint of suppressing thermal damage of the resin layer. In this case, the pulsed laser light is applied not only to the resin layer but also to the metal layer.

Figure 1B:
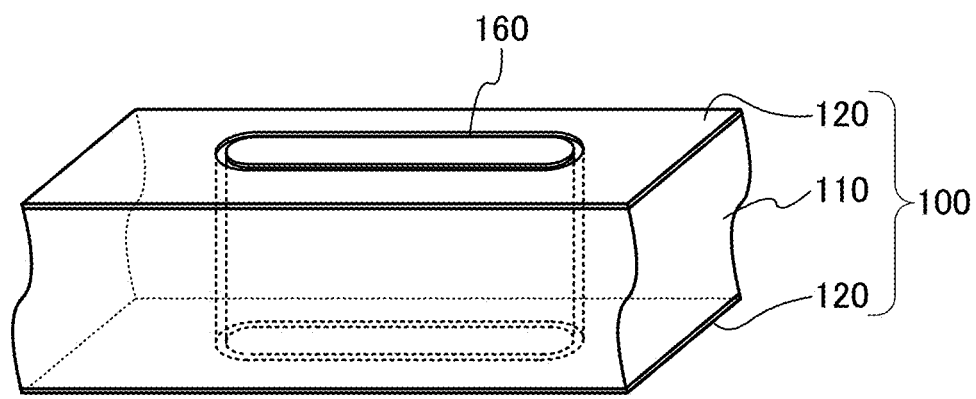
Figure 1C:
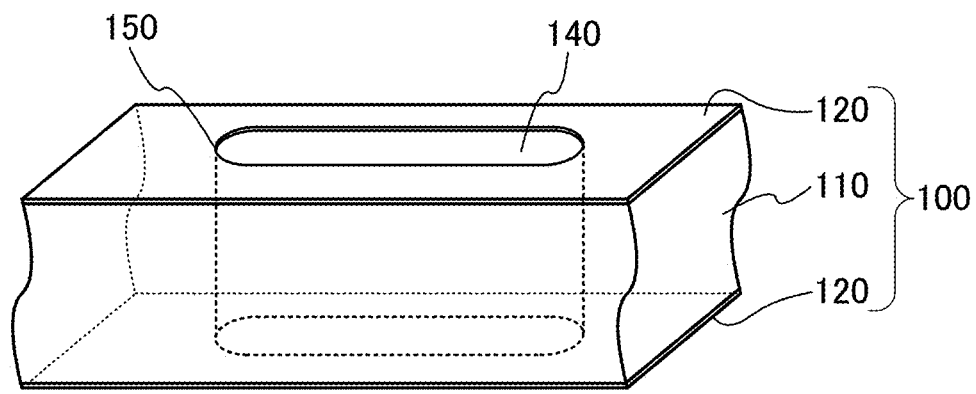

FIG. 1A to FIG. 1C are schematic views of steps of forming opening 140 as a through hole in resin substrate 110. In the example illustrated in FIG. 1A to FIG. 1C, the both surfaces of resin layer 110 are covered with metal layer 120.

As illustrated in FIG. 1A, while irradiating resin substrate 100 having resin layer 110 and metal layer 120 covering the both surfaces of resin layer 110 with pulsed laser light 130, the relative position of the condensing point of pulsed laser light 130 and resin substrate 100 is changed. At this time, the condensing point of pulsed laser light 130 is located at an inner portion of resin layer 110, and scanning with pulsed laser light 130 along predetermined outer edge line 150' of the opening 140 to be formed is performed in multiple rounds. By performing the scanning with pulsed laser light 130 in multiple rounds in the above-mentioned manner, groove 160 having a depth equal to the thickness of resin substrate 100 can be formed over the whole circumference of outer edge 150 of opening 140 as illustrated in FIG. 1B. Thereafter, as illustrated in FIG. 1C, opening 140 is formed by removing the portion separated by groove 160. Through the above-mentioned procedure, opening 140 can be formed in resin substrate 100. In this manner, a processed resin substrate can be manufactured.

It is to be noted that the shape of opening 140 is not limited to the shape illustrated in FIG. 1C. The cross-sectional shape of opening 140 in the direction along the substrate surface is not limited, and is, for example, a circular shape, an ellipse shape, a rectangular shape, or an elongated round shape. Alternatively, the cross-sectional shape of opening 140 in the direction along the substrate surface may be more complicated shapes. In addition, the scanning direction of pulsed laser light 130 is not limited to the clockwise direction illustrated in FIG. 1C, and may be the counterclockwise direction.

In addition, the position of the condensing point of pulsed laser light 130 is not limited to the position illustrated in FIG. 1A. For example, with the condensing point of pulsed laser light 130, scanning may be performed on predetermined outer edge line 150', or performed inside predetermined outer edge line 150' in a direction substantially parallel to predetermined outer edge line 150'. In addition, the position (depth) of the condensing point of pulsed laser light 130 in the thickness direction of resin substrate 100 may be constant regardless of the progress of the processing, or may be changed in accordance with the progress of the processing. For example, in the case where the thickness of resin substrate 100 is non-uniform, the position (depth) of the condensing point of pulsed laser light 130 may be changed in accordance with the thickness of resin substrate 100.

In the laser processing method according to the present embodiment, scanning with pulsed laser light 130 is performed such that the interval of irradiation at each point on predetermined outer edge line 150' of opening 140 between each round is 5 msec or more. For example, scanning with pulsed laser light 130 is performed such that, at point A located on predetermined outer edge line 150' in FIG. 1A, the interval between irradiation with pulsed laser light 130 of nth-round and irradiation with pulsed laser light 130 of (n+1)th-round is 5 msec or more. In this manner, the excessive thermal energy accumulated in resin layer 110 can be effectively dissipated to metal layer 120 in a period between each round, and thermal damage at the processing portion of resin layer 110 can be suppressed.

The method for applying pulsed laser light 130 such that the interval of irradiation at each point on predetermined outer edge line 150' of opening 140 between each round is 5 msec or more is not limited, and may be appropriately selected in accordance with the shape, size, and number of opening 140, and the like. For example, the above-mentioned condition can be satisfied by reducing the scanning speed of pulsed laser light 130. In addition, even in the case where the scanning speed of pulsed laser light 130 is high (for example, 1000 mm/sec or more), the scanning time of one round of pulsed laser light 130 is 5 msec or more when opening 140 is large.

On the other hand, in the case where the scanning speed of pulsed laser light 130 is high (for example, 1000 mm/sec or more), and the size of opening 140 is small, the scanning time of one round of pulsed laser light 130 is less than 5 msec. In this case, it suffices to intermittently stop irradiation (scanning) with pulsed laser light 130 such that the interval of irradiation at each point on predetermined outer edge line 150' of opening 140 between each round is 5 msec or more. For example, in the case where the scanning time of one round of pulsed laser light 130 is 3 msec, it suffices to stop the scanning with pulsed laser light 130 for 2 msec or more in each round. The timing of stopping the irradiation with pulsed laser light 130 is not limited, and the irradiation may be stopped on a half-round basis, for example.

In addition, in the case where a plurality of openings 140 are formed in one resin substrate 100, the irradiation region of pulsed laser light 130 (the region where opening 140 is to be formed) may be changed for each round. For example, when forming two openings, a first opening and a second opening, it suffices to perform irradiation such that, after pulsed laser light is applied along the predetermined outer edge line of the first opening in one round, pulsed laser light is applied along the predetermined outer edge line of the second opening in one round before performing the next irradiation along the predetermined outer edge line of the first opening. By alternately applying the pulsed laser light to the region where the first opening is to be formed and the region where the second opening is to be formed in the above-mentioned manner, the interval of irradiation at each point on predetermined outer edge line 150' of opening 140 between each round can be set to 5 msec or more without significantly reducing the processing efficiency.

The wavelength of pulsed laser light 130 is not limited as long as groove 160 can be appropriately formed in resin substrate 100. From the viewpoint of suppressing undesirable thermal damage at the processing portion of resin layer 110, the wavelength of pulsed laser light 130 is preferably 250 to 2000 nm, more preferably, 250 to 1500 nm. For example, the wavelength of pulsed laser light 130 is 355 nm.

The pulse energy of pulsed laser light 130 is not limited as long as groove 160 can be appropriately formed in resin substrate 100. From the viewpoint of increasing the processing speed, the pulse energy of pulsed laser light 130 is preferably 3 µJ or greater.

The output of pulsed laser light 130 is not limited as long as groove 160 can be appropriately formed in resin substrate 100. From the viewpoint of increasing the processing speed, the output of pulsed laser light 130 is preferably 10 W or greater.

The pulse width of pulsed laser light 130 is not limited as long as groove 160 can be appropriately formed in resin substrate 100. From the viewpoint of improving the processing quality, the pulse width of pulsed laser light 130 is preferably 10 psec to 100 nsec.

The repetition frequency of pulsed laser light 130 is not limited as long as groove 160 can be appropriately formed in resin substrate 100. From the viewpoint of improving the processing quality, the repetition frequency of pulsed laser light 130 is preferably 100 kHz or greater, or more preferably 1 MHz or greater.

The pulse energy and the fluence of pulsed laser light 130 is not limited as long as groove 160 can be appropriately formed in resin substrate 100. For example, in the case where the wavelength of pulsed laser light 130 is 355 nm, the pulse energy of pulsed laser light 130 is preferably 3 µJ or greater from the viewpoint of increasing the processing speed. Likewise, in the case where the wavelength of pulsed laser light 130 is 355 nm, the fluence of pulsed laser light 130 on the surface of resin substrate 100 (the surface of metal layer 110 on which pulsed laser light 130 is applied) is preferably 3 J/cm$^2$ or greater, and the fluence of pulsed laser light 130 at the condensing point is preferably 10 J/cm$^2$ or greater from the viewpoint of increasing the processing speed. Here, "the surface of resin substrate 100" means the surface of metal layer 120 in the case where pulsed laser light 130 is applied to the surface where metal layer 120 is formed in the surface of resin layer 110, or is the surface of resin layer 110 in the case where pulsed laser light 130 is applied to the surface where metal layer 120 is not formed in the surface of resin layer 110.

While the scanning speed of pulsed laser light 130 is not limited, the scanning speed of pulsed laser light 130 is preferably 1000 mm/sec or more from the viewpoint of increasing the processing speed. In addition, the number of cycles of scanning with pulsed laser light 130 for each opening 140 is not limited as long as groove 160 having a depth equal to the thickness of resin substrate 100 can be formed, and may be appropriately set in accordance with the material of resin substrate 100, the output of pulsed laser light 130 and the like.

As described above, in the manufacturing method of a processed resin substrate according to the present embodiment, at least a part of one surface of the resin layer is covered with the metal layer, and the interval of irradiation of the pulsed laser light at each point on the resin substrate is set to 5 msec or more. In this manner, the manufacturing method of a processed resin substrate according to the present embodiment can form a through hole in the resin substrate (the resin layer) while suppressing undesirable thermal damages such as burning and digging even when laser light having a high output (for example, 10 W or greater) is applied at a high scanning speed (for example, 1000 mm/sec or more). Accordingly, the manufacturing method of a processed resin substrate according to the present embodiment can speedily form a through hole in a resin substrate without reducing the processing quality. In addition, even when a reinforcement such as a glass fiber is present in the resin layer, the manufacturing method of a processed resin substrate according to the present embodiment can form a through hole in the resin substrate without melting the reinforcement.

The way of implementing the manufacturing method of a processed resin substrate according to the present embodiment is not limited. For example, the manufacturing method of a processed resin substrate according to the present embodiment can be implemented with the laser processing apparatus according to the present embodiment described below.

2. Laser Processing Apparatus

The laser processing apparatus according to the present embodiment is used in the second step of the laser processing method according to the present embodiment. That is, the laser processing apparatus according to the present embodiment is an apparatus that irradiates a resin substrate including a resin layer and a metal layer that covers at least a part of one surface of the resin layer with pulsed laser light to form a through hole.

The laser processing apparatus according to the present embodiment includes, at least, a laser light source that emits pulsed laser light, a stage, an optical system that guides pulsed laser light emitted from the laser light source to a resin substrate placed on the stage, a scanning section that relatively moves the resin substrate placed on the stage and the condensing point of the pulsed laser light, and a control section that controls the operation of the scanning section. Each component is described below.

The laser light source emits pulsed laser light for irradiating the resin substrate. The type of the laser used as the laser light source is not limited, and is appropriately selected in accordance with the type of the resin substrate and the like. Examples of the laser include a fiber laser and the like.

On the stage, a processing object, that is, a resin substrate including a resin layer, and a metal layer that covers at least a part of one surface of the resin layer is placed.

The optical system guides pulsed laser light emitted from the laser light source to the resin substrate placed on the stage such that the condensing point is located at a desired position. Normally, the optical system includes a telescope optical system that optimizes the beam diameter of pulsed laser light, a condenser lens that condenses pulsed laser light at a desired position, and the like.

The scanning section moves at least one of the stage and the condensing point of the pulsed laser light to relatively move the resin substrate placed on the stage and the condensing point of the pulsed laser light. In this manner, it is possible to form a through hole (opening) in the resin substrate by performing scanning such that the condensing point of the pulsed laser light is applied along a predetermined outer edge line of the through hole (opening) to be formed. The scanning section may move the stage on which the resin substrate is placed, or the condensing point of the pulsed laser light, or both. The driving section is, for example, an XY-stage controller, a galvano scanner, or the like.

The control section controls the scanning section such that pulsed laser light is applied along the predetermined outer edge line of the through hole (opening) to be formed in multiple rounds, and the interval of irradiation at each point on the predetermined outer edge line between each round is 5 msec or more. The control section is, for example, a computer connected with the scanning section.

Further, the laser processing apparatus may include an automatic aiming system for setting the position of the condensing point of the pulsed laser light at a desired position in a resin substrate and the like.

Figure 2:
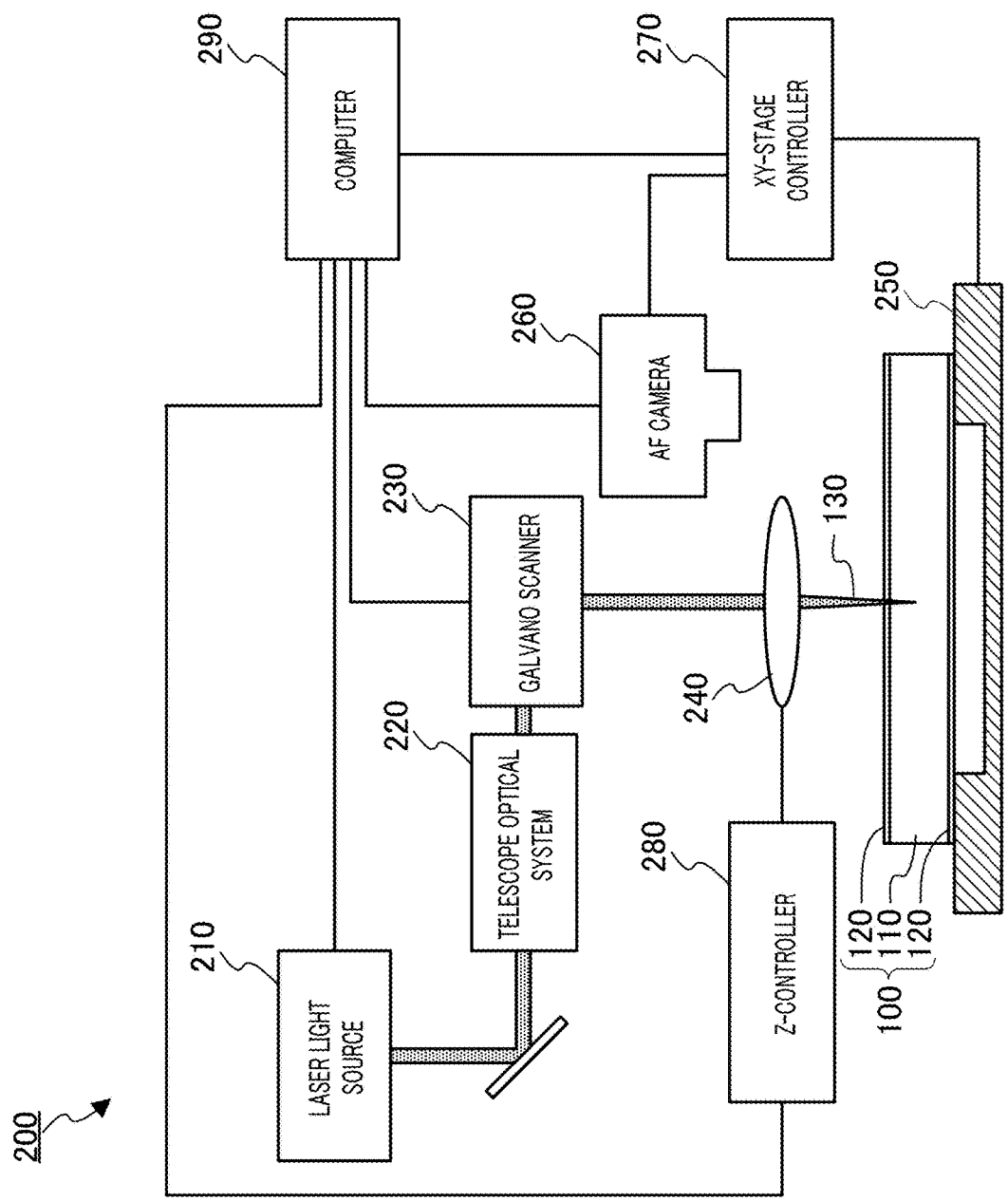
FIG. 2 is a schematic view illustrating an example of a laser processing apparatus according to the embodiment of the present invention.

FIG. 2 is a schematic view illustrating a laser processing apparatus according to the embodiment of the present invention. As illustrated in FIG. 2, laser processing apparatus 200 includes laser light source 210, telescope optical system 220, galvano scanner 230, fθ lens 240, stage 250, AF camera 260, XY-stage controller 270, Z-controller 280 and computer 290. In this example, resin substrate 100 as a processing object includes resin layer 110, and metal layer 120 that covers the both surfaces of resin layer 110.

Laser light source 210 emits pulsed laser light 130 having a given wavelength. As described above, the type of the laser used as laser light source 210 is appropriately selected in accordance with the type of resin substrate 110 as the processing object and the like.

Telescope optical system 220 optimizes the beam diameter of pulsed laser light 130 emitted from laser light source 210 to obtain a preferable processing shape.

In response to a request from computer 290, galvano scanner 230 changes the travelling direction of pulsed laser light 130 optimized by telescope optical system 220. Pulsed laser light 130 whose travelling direction is controlled by galvano scanner 230 is condensed in resin substrate 100 by fθ lens 240. With such a combination of galvano scanner 230 and fθ lens 240, scanning with the condensing point of pulsed laser light 130 can be performed along predetermined outer edge line 150' of the opening 140 to be formed at a constant speed.

Stage 250 includes a mounting stand on which resin substrate 100 is placed, and a driving mechanism that can move the mounting stand. The driving mechanism can move the mounting stand in the X-axis direction or the Y-axis direction, and can rotate the mounting stand around the X axis or the Y axis. Resin substrate 100 on stage 250 is moved in the XY-axis direction by the driving mechanism.

AF camera 260 is a camera for acquiring the profile of the surface of a processing portion of resin substrate 100. The acquired profile is output to computer 290.

In response to a request from computer 290, XY-stage controller 270 moves stage 250 in the XY-axis direction such that the condensing point of pulsed laser light 130 is located at the region where opening 140 is to be formed in resin substrate 100.

In response to a request from computer 290, Z-controller 280 moves fθ lens 240 in the Z-axis direction such that the condensing point of pulsed laser light 130 is located in the resin layer 120.

Computer 290 is connected with laser light source 210, galvano scanner 230, AF camera 260, XY-stage controller 270 and Z-controller 280, and comprehensively controls the connected components. For example, computer 280 controls AF camera 260 and XY-stage controller 270 to acquire the profile of the surface of resin substrate 100. In addition, computer 290 controls galvano scanner 230 and Z-controller 270 to perform scanning with pulsed laser light 130 in multiple rounds along predetermined outer edge line 150' of opening 140. In addition, computer 280 controls XY-stage controller 260 to move stage 250 such that the region where opening 140 is to be formed can be irradiated with pulsed laser light 130.

Next, procedure of forming opening 140 as a through hole in resin substrate 100 with use of laser processing apparatus 200 is described.

First, resin substrate 100 is placed on the mounting stand of stage 250, and the profile of the surface of resin substrate 100 is acquired with AF camera 260 and XY-stage controller 270.

Next, resin substrate 100 is moved to a given position with XY-stage controller 270, and thereafter pulsed laser light 130 is emitted from laser light source 210 to irradiate resin substrate 100 with pulsed laser light 130. At this time, the travelling direction of pulsed laser light 130 is changed with galvano scanner 230 to thereby perform scanning with pulsed laser light 130 in multiple rounds along predetermined outer edge line 150' of opening 140 to be formed (see FIG. 1A). In addition, the scanning with pulsed laser light 130 is performed such that the interval of irradiation at each point on predetermined outer edge line 150' of opening 140 between each round is 5 msec or more. For example, the scanning with pulsed laser light 130 is stopped for a given time in each round such that the interval of irradiation at each point on predetermined outer edge line 150' of opening 140 between each round is 5 msec or more. By applying pulsed laser light 130 in this manner, groove 160 that reaches the rear surface of resin substrate 100 can be formed along predetermined outer edge line 150' of opening 140 while suppressing undesirable thermal damages such as burning and digging (see FIG. 1B). In the case where a plurality of openings 140 are formed in resin substrate 100, it suffices to repeat the above-mentioned steps after moving resin substrate 100 with XY-stage controller 270.

Finally, the portion separated by groove 160 is removed, and thus opening 140 is formed (see FIG. 1C).

Through the above-mentioned procedure, a through hole can be formed in resin substrate 100 while suppressing undesirable thermal damages such as burning and digging.

While FIG. 2 illustrates an example case where the travelling direction of pulsed laser light 130 is changed with galvano scanner 230 to apply pulsed laser light 130 along predetermined outer edge line 150' of opening 140, the way of applying pulsed laser light 130 along predetermined outer edge line 150' of opening 140 is not limited as long as the condensing point of pulsed laser light 130 and resin substrate 100 can be relatively moved. For example, stage 250 or the optical system (telescope optical system 220 and the condenser lens) may be moved without using galvano scanner 230.

EXAMPLES

The present invention will be described in detail with Examples. The present invention is not limited to Examples.

Example 1

As a processing object, a glass epoxy substrate (thickness: 300 to 330 μm) on which a copper layer (thickness: 2 to 5 μm) is bonded on the both sides thereof was prepared.

With use of the laser processing apparatus illustrated in FIG. 2, the glass epoxy substrate was irradiated with pulsed laser light along the predetermined outer edge line of the opening to form an opening having an elongated round shape (the length of the straight line portion: 2 mm, the diameter of the arc portion: 0.55 mm). The scanning time of one round of the predetermined outer edge line of the opening was 2.9 msec. In addition, in each round of the scanning with the pulsed laser light, irradiation (scanning) with the pulsed laser light was stopped for a given time (0 to 150 msec) to change the interval of the irradiation between each round at each point on the predetermined outer edge line of the opening. The interval of the irradiation between each round at each point on the predetermined outer edge line of the opening is calculated by "2.9 msec (scanning time of one round)+0 to 150 msec (scanning stop time)."

The condition of the processing was as follows. The "spot diameter" means the diameter of the range up to the light intensity of $1/e^2$ with respect to the center portion (the same applies to the following Examples).

Figure 3A:
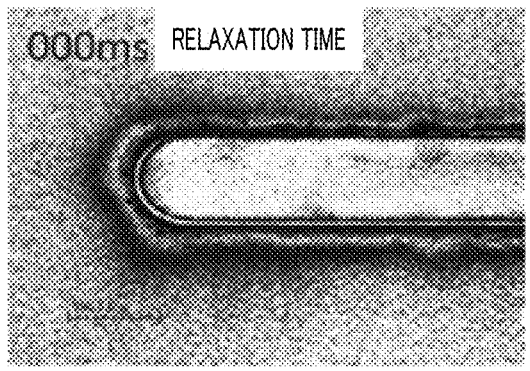
FIG. 3A to FIG. 3F are photographs of surfaces of substrates showing experiment results of Example 1.
Figure 3D:
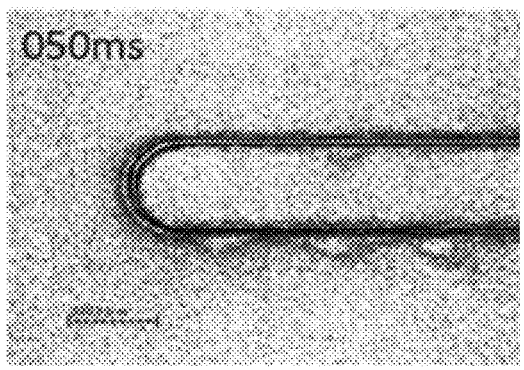
Figure 3B:
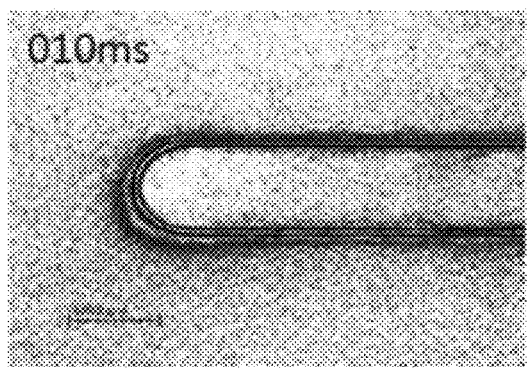
Figure 3E:
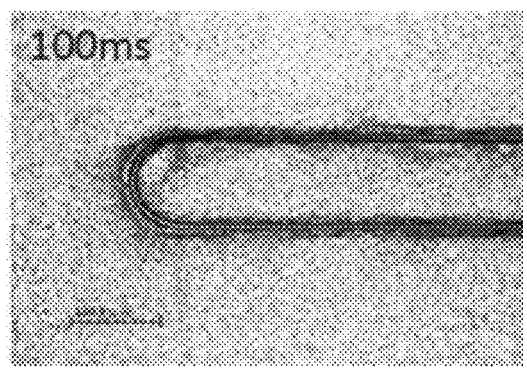
Figure 3C:
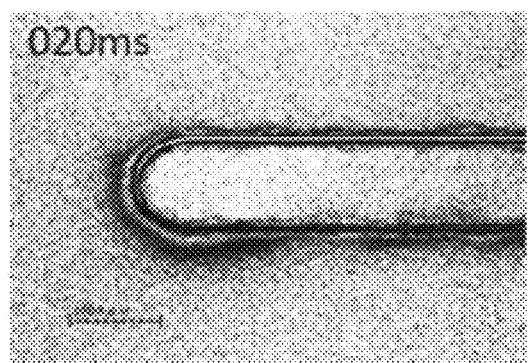
Figure 3F:
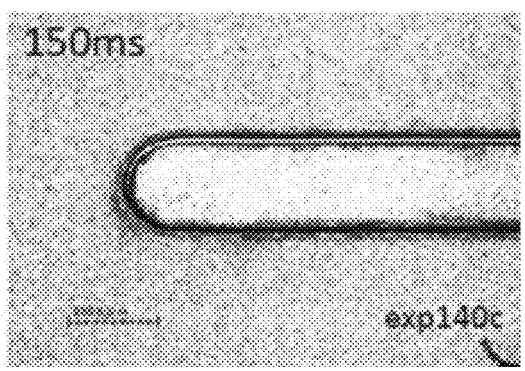

Wavelength: 355 nm
Pulse width: 2 ns
Output: 30 W
Pulse energy: 15 μJ
Repetition frequency: 2 MHz
Position of condensing point: 100 μm from the surface of the copper layer on the front side
Spot diameter of the surface of the copper layer on the front side: 10.5 μm
Fluence of the surface of the copper layer on the front side: 18 J/cm$^2$
Spot diameter at the condensing point: 5.6 μm
Fluence at the condensing point: 61 J/cm$^2$
Scanning speed: 2000 mm/s
Scanning cycle: 60 cycles FIG. 3A to FIG. 3F are photographs (plan views) of substrates after pulsed laser light is applied along the predetermined outer edge line of the opening in 60 cycles (see FIG. 1B). FIG. 3A is a photograph of a substrate irradiated with pulsed laser light with a scanning stop time of 0 msec (continuous scan). FIG. 3B is a photograph of a substrate irradiated with pulsed laser light with a scanning stop time of 10 msec. FIG. 3C is a photograph of a substrate irradiated with pulsed laser light with a scanning stop time of 20 msec. FIG. 3D is a photograph of a substrate irradiated with pulsed laser light with a scanning stop time of 50 msec. FIG. 3E is a photograph of a substrate irradiated with pulsed laser light with a scanning stop time of 100 msec. FIG. 3F is a photograph of a substrate irradiated with pulsed laser light with a scanning stop time of 150 msec.

As illustrated in FIG. 3A, in the case where the interval of the irradiation between each round at each point on the predetermined outer edge line of the opening was 2.9 msec (in the case where the scanning stop time was 0 msec), burning occurred in a region around the processing portion. On the other hand, as illustrate in FIG. 3B to FIG. 3F, in the case where the interval of the irradiation between each round at each point on the predetermined outer edge line of the opening was 12.9 msec or more (in the case where the scanning stop time was 10 to 150 msec), almost no burning occurred in a region around the processing portion. From the above-mentioned results, it can be said that undesirable thermal damages such as burning can be suppressed by setting the interval of the irradiation between each round at each point on the predetermined outer edge line of the opening to 5 msec or more.

Example 2

As a processing object, a glass epoxy substrate (thickness: 300 to 330 μm) on which a copper layer (thickness: 2 to 5 μm) is bonded on the both sides thereof was prepared.

With use of the laser processing apparatus illustrated in FIG. 2, the glass epoxy substrate was irradiated with pulsed laser light along the predetermined outer edge line of the opening to form an opening having a circular shape (having a diameter of 1 mm). The scanning time of one round of the predetermined outer edge line of the opening was 0.8 msec. In addition, in each round of the scanning with the pulsed laser light, irradiation (scanning) with the pulsed laser light was stopped for a given time (0 to 100 msec) to change the interval of the irradiation between each round at each point on the predetermined outer edge line of the opening. The interval of the irradiation between each round at each point on the predetermined outer edge line of the opening is calculated by "0.8 msec (scanning time of one round)+0 to 100 msec (scanning stop time)."

The condition of the processing was as follows.
Wavelength: 355 nm
Pulse width: 2 ns
Output: 30 W
Pulse energy: 15 µJ
Repetition frequency: 2 MHz
Position of condensing point: 100 µm from the surface of the copper layer on the front side
Spot diameter of the surface of the copper layer on the front side: 10.5 µm
Fluence of the surface of the copper layer on the front side: 18 J/cm$^2$
Spot diameter at the condensing point: 5.6 µm
Fluence at the condensing point: 61 J/cm$^2$
Scanning speed: 2000 mm/s
Scanning cycle: 60 cycles FIG. 4A to FIG. 4Q are photographs (plan views) of substrates after pulsed laser light is applied along the predetermined outer edge line of the opening in 60 cycles (see FIG. 1B). FIG. 4A is a photograph of a substrate irradiated with pulsed laser light with a scanning stop time of 0 msec (continuous scan). FIG. 4B is a photograph of a substrate irradiated with pulsed laser light with a scanning stop time of 1 msec. FIG. 4C is a photograph of a substrate irradiated with pulsed laser light with a scanning stop time of 2 msec. FIG. 4D is a photograph of a substrate irradiated with pulsed laser light with a scanning stop time of 3 msec. FIG. 4E is a photograph of a substrate irradiated with pulsed laser light with a scanning stop time of 4 msec. FIG. 4F is a photograph of a substrate irradiated with pulsed laser light with a scanning stop time of 5 msec. FIG. 4G is a photograph of a substrate irradiated with pulsed laser light with a scanning stop time of 6 msec. FIG. 4H is a photograph of a substrate irradiated with pulsed laser light with a scanning stop time of 7 msec. FIG. 4I is a photograph of a substrate irradiated with pulsed laser light with a scanning stop time of 8 msec. FIG. 4J is a photograph of a substrate irradiated with pulsed laser light with a scanning stop time of 9 msec. FIG. 4K is a photograph of a substrate irradiated with pulsed laser light with a scanning stop time of 10 msec. FIG. 4L is a photograph of a substrate irradiated with pulsed laser light with a scanning stop time of 15 msec. FIG. 4M is a photograph of a substrate irradiated with pulsed laser light with a scanning stop time of 20 msec. FIG. 4N is a photograph of a substrate irradiated with pulsed laser light with a scanning stop time of 25 msec. FIG. 4O is a photograph of a substrate irradiated with pulsed laser light with a scanning stop time of 30 msec. FIG. 4P is a photograph of a substrate irradiated with pulsed laser light with a scanning stop time of 50 msec. FIG. 4Q is a photograph of a substrate irradiated with pulsed laser light with a scanning stop time of 100 msec.

As illustrated in FIG. 4A to FIG. 4E, in the case where the interval of the irradiation between each round at each point on the predetermined outer edge line of the opening was 0.8 to 4.8 msec (in the case where the scanning stop time was 0 to 4 msec), burning occurred in a region around the processing portion. On the other hand, as illustrated in FIG. 4F to FIG. 4Q, in the case where the interval of the irradiation between each round at each point on the predetermined outer edge line of the opening was 5.8 msec or more (in the case where the scanning stop time was 5 to 100 msec), almost no burning occurred in a region around the processing portion. From the above-mentioned results, it can be said that undesirable thermal damages such as burning can be suppressed by setting the interval of the irradiation between each round at each point on the predetermined outer edge line of the opening to 5 msec or more.

Example 3

As a processing object, a glass epoxy substrate (thickness: 300 to 330 µm) on which a copper layer (thickness: 2 to 5 µm) is bonded on the both sides thereof was prepared.

With use of the laser processing apparatus illustrated in FIG. 2, the glass epoxy substrate was irradiated with pulsed laser light along the predetermined outer edge line of the opening to form openings of two types (the length of the straight line portion: 2 mm or 14.6 mm, the diameter of the arc portion: 0.55 mm) having an elongated round shape which differ from each other in length of the straight line portion. The scanning time of one round of the predetermined outer edge line of the opening whose length of the straight line portion is 2 mm was 2.9 msec. The scanning time of one round of the predetermined outer edge line of the opening whose length of the straight line portion is 14.6 mm was 15.5 msec. In addition, in each round of the scanning with the pulsed laser light, irradiation (scanning) with the pulsed laser light was stopped for a given time (0 to 100 msec) to change the interval of the irradiation between each round at each point on the predetermined outer edge line of the opening. The interval of the irradiation between each round at each point on the predetermined outer edge line of the opening whose length of the straight line portion is 2 mm is calculated by "2.9 msec (scanning time of one round)+0 to 100 msec (scanning stop time)." Likewise, the interval of the irradiation between each round at each point on the predetermined outer edge line of the opening whose length of the straight line portion is 14.6 mm is calculated by "15.5 msec (scanning time of one round)+0 to 100 msec (scanning stop time)."

The condition of the processing was as follows.
Wavelength: 355 nm
Pulse width: 2 ns
Output: 30 W
Pulse energy: 15 µJ
Repetition frequency: 2 MHz
Position of condensing point: 100 µm from the surface of the copper layer on the front side
Spot diameter of the surface of the copper layer on the front side: 10.5 µm
Fluence of the surface of the copper layer on the front side: 18 J/cm$^2$
Spot diameter at the condensing point: 5.6 µm
Fluence at the condensing point: 61 J/cm$^2$
Scanning speed: 2000 mm/s
Scanning cycle: 60 cycles FIG. 5A and FIG. 5B are photographs (plan views) of substrates after pulsed laser light is applied along the predetermined outer edge line of the opening in 60 cycles (see FIG. 1B). FIG. 5A is a photograph of a substrate after pulsed laser light was applied to form an opening whose length of the straight line portion is 2 mm, and FIG. 5B is a photograph of a substrate after pulsed laser light was applied to form an opening whose length of the straight line portion is 14.6 mm. In the two substrates, seven openings were formed for each scanning stop time. For example, the seven irradiation regions of the upper right portion enclosed with the broken line were irradiated with pulsed laser light with a scanning stop time of 0 msec (continuous scan), and the seven irradiation regions of the lower left portion enclosed with the broken line were irradiated with pulsed laser light with a scanning stop time of 100 msec.

As illustrated in FIG. 5A, in the case where the scanning time of one round of the predetermined outer edge line of the opening was 2.9 msec, burning occurred in a region around the processing portion when the interval of the irradiation between each round at each point was 2.9 to 4.9 msec (when the scanning stop time was 0 to 2 msec), whereas almost no burning occurred in a region around the processing portion when the interval of the irradiation between each round at each point was 5.9 to 102.9 msec (when the scanning stop time was 3 to 100 msec). On the other hand, as illustrated in FIG. 5B, in the case where the scanning time of one round of the predetermined outer edge line of the opening was 15.5 msec, almost no burning occurred in a region around the processing portion regardless of the scanning stop time. From the above-mentioned results, it can be said that undesirable thermal damages such as burning can be suppressed by setting the interval of the irradiation between each round at each point on the predetermined outer edge line of the opening to 5 msec or more. In addition, it can be said that the scanning with pulsed laser light is not required to be stopped in the case where the scanning time of one round of the predetermined outer edge line of the opening is 5 msec or more.

Figure 6C:
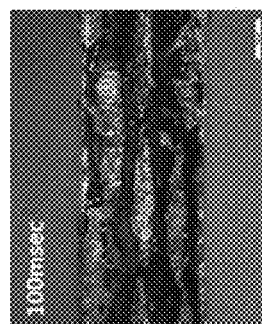
FIG. 6A to FIG. 6H are photographs of cross sections of substrates showing experiment results of Example 3.
Figure 6B:
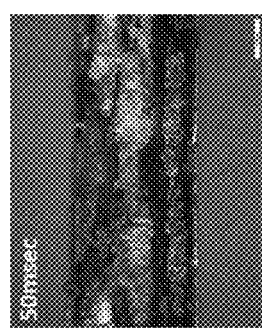
Figure 6A:
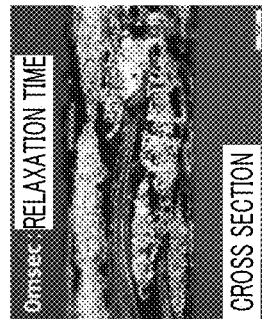
Figure 6H:
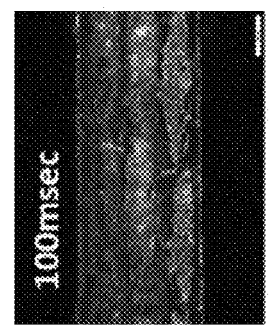
Figure 6G:
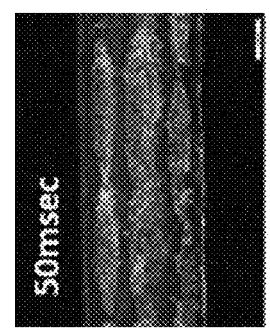
Figure 6F:
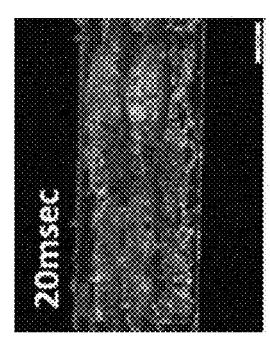
Figure 6E:
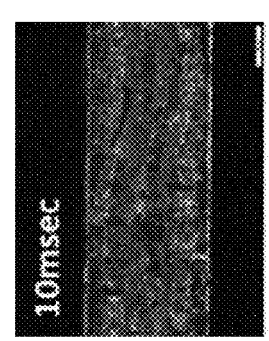
Figure 6D:
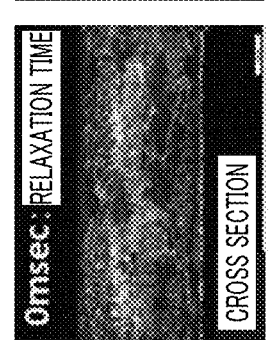

FIG. 6A to FIG. 6H are photographs (cross sections) of openings after formation of the openings (see FIG. 1C). FIG. 6A to FIG. 6C are photographs of the processed cross sections of openings whose length of the straight line portion is 2 mm, and FIG. 6D to FIG. 6H are photographs of processed cross sections of openings whose length of the straight line portion is 14.6 mm. FIG. 6A and FIG. 6D illustrate openings formed with a scanning stop time of 0 msec (continuous scan). FIG. 6E illustrates an opening formed with a scanning stop time of 10 msec. FIG. 6F illustrates an opening formed with a scanning stop time of 20 msec. FIG. 6B and FIG. 6G illustrate openings formed with a scanning stop time of 50 msec. FIG. 6C and FIG. 6H illustrate openings formed with a scanning stop time of 100 msec.

As illustrated in FIG. 6A to FIG. 6C, in the case where the scanning time of one round of the predetermined outer edge line of the opening was 2.9 msec, the glass fiber was melted at the processed portion when the interval of the irradiation between each round at each point is 2.9 msec (when the scanning stop time was 0 msec), whereas almost no glass fiber was melted when the interval of the irradiation between each round at each point is 12.9 to 102.9 msec (when the scanning stop time was 10 to 100 msec). On the other hand, as illustrated in FIG. 6D to FIG. 6H, in the case where the scanning time of one round of the predetermined outer edge line of the opening was 15.5 msec, the almost no glass fiber was melted regardless of scanning stop time. From the above-mentioned results, it can be said that reduction in processing quality such as melting of the glass fiber can be suppressed by setting the interval of the irradiation between each round at each point on the predetermined outer edge line of the opening to 5 msec or more. In addition, it can be said that the scanning with pulsed laser light is not required to be stopped in the case where the scanning time of one round of the predetermined outer edge line of the opening is 5 msec or more.

Example 4

As a processing object, a glass epoxy substrate (thickness: 300 to 330 μm) on which a copper layer (thickness: 2 to 5 μm) is bonded on the both sides thereof was prepared.

With use of the laser processing apparatus illustrated in FIG. 2, the glass epoxy substrate was irradiated with pulsed laser light along the predetermined outer edge line of the opening to form an opening (diameter 0.4 mm) having a circular shape. The scanning time of one round of the predetermined outer edge line of the opening was 2.1 msec. At this time, the pulse energy was changed (8.3 to 50.3 μJ. In addition, in each round of the scanning with the pulsed laser light, irradiation (scanning) with the pulsed laser light was stopped for 100 msec (continuous irradiation was also performed for comparison purpose). The interval of the irradiation between each round at each point on the predetermined outer edge line of the opening is calculated by "2.1 msec (scanning time of one round)+100 msec (scanning stop time)."

The condition of the processing was as follows.
Wavelength: 355 nm
Pulse width: 2 ns
Output: 4.98 to 30.18 W
Pulse energy: 8.3 to 50.3 μJ
Repetition frequency: 600 kHz
Position of condensing point: 100 μm from the surface of the copper layer on the front side
Spot diameter of the surface of the copper layer on the front side: 10.5 μm
Fluence of the surface of the copper layer on the front side: 10.0 to 60.0 J/cm$^2$
Spot diameter at the condensing point: 5.6 μm
Fluence at the condensing point: 33.7 to 204 J/cm$^2$
Scanning speed: 600 mm/s
Scanning cycle: 10 cycles FIG. 7A to FIG. 7H are photographs (plan views) of substrates after pulsed laser light was applied along the predetermined outer edge line of the opening in 10 cycles (see FIG. 1B). FIG. 7A to FIG. 7D are photographs of substrates irradiated with pulsed laser light with a scanning stop time of 0 msec (continuous scan), and FIG. 7E to FIG. 7H are photographs of substrates irradiated with pulsed laser light with a scanning stop time of 100 msec. FIG. 7A and FIG. 7E are photographs of substrates irradiated with pulsed laser light having a pulse energy of 8.3 μJ (surface fluence: 10.0 J/cm$^2$, internal condense light fluence: 33.7 J/cm$^2$). FIG. 7B and FIG. 7F are photographs of substrates irradiated with pulsed laser light having a pulse energy of 10.6 μJ (surface fluence: 12.7 J/cm$^2$, internal condense light fluence: 43.1 J/cm2). FIG. 7C and FIG. 7G are photographs of substrates irradiated with pulsed laser light having a pulse energy of 13.8 μJ (surface fluence: 16.6 J/cm$^2$, internal condense light fluence: 56.1 J/cm$^2$). FIG. 7D and FIG. 7H are photographs of substrates irradiated with pulsed laser light having a pulse energy of 50.3 μJ (surface fluence: 60.0 J/cm$^2$, internal condense light fluence: 204 J/cm$^2$). It is to be noted that, in FIG. 7D and FIG. 7H, portions separated by irradiation with laser are dropped off.

As illustrated in FIG. 7A to FIG. 7D, in the case where the interval of the irradiation between each round at each point on the predetermined outer edge line of the opening was 2.1 msec (in the case where the scanning stop time was 0 msec), burning occurred in a region around the processing portion regardless of the pulse energy. On the other hand, as illustrated in FIG. 7E to FIG. 7H, in the case where the interval of the irradiation between each round at each point on the predetermined outer edge line of the opening was 102.1 msec (in the case where the scanning stop time was 100 msec), almost no burning occurred in a region around the processing portion regardless of the pulse energy. From the above-mentioned results, it can be said that undesirable thermal damages such as burning can be suppressed, regardless of the pulse energy, by setting the interval of the irradiation between each round at each point on the predetermined outer edge line of the opening to 5 msec or more.

Example 5

As a processing object, a glass epoxy substrate (having a thickness, including the copper layer, of 200 μm) on which a copper layer (thickness: 2 to 5 μm) is bonded on the both sides thereof was prepared.

With use of the laser processing apparatus illustrated in FIG. 2, the glass epoxy substrate was irradiated with pulsed laser light along the predetermined outer edge line of the opening to form an opening having an elongated round shape (the length of the straight line portion: 5.5 mm, the diameter of the arc portion: 0.5 mm). The scanning time of one round of the predetermined outer edge line of the opening was 63 msec. In addition, in each round of the scanning with the pulsed laser light, irradiation (scanning) with the pulsed laser light was stopped for 184 msec. The interval of the irradiation between each round at each point on the predetermined outer edge line of the opening is calculated by "63 msec (scanning time of one round)+184 msec (scanning stop time)."

Figure 8:
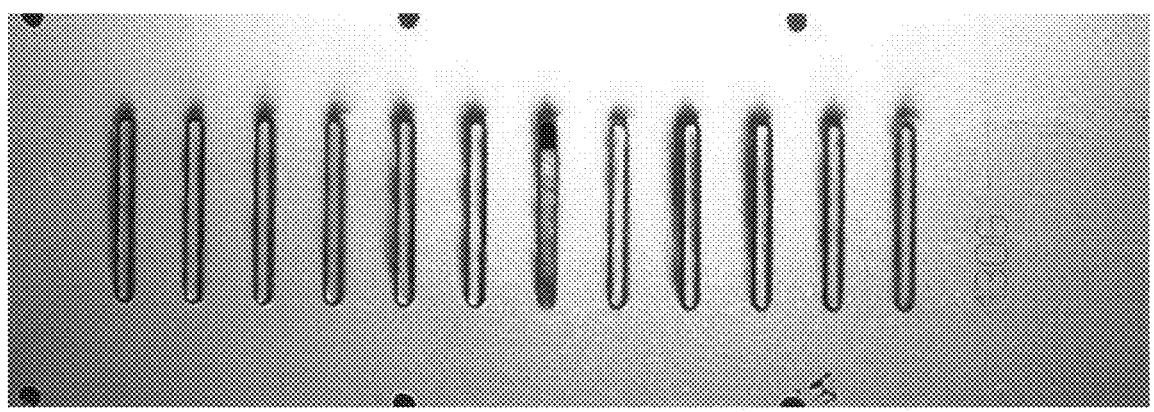
FIG. 8 is a photograph of a substrate surface showing an experiment result of Example 5.

The condition of the processing was as follows.
Wavelength: 1064 nm
Pulse width: 15 ps
Output: 12 W
Pulse energy: 60 μJ
Repetition frequency: 200 kHz
Position of condensing point: 70 μm from the surface of the copper layer on the front side
Spot diameter of the surface of the copper layer on the front side: 9.9 μm
Fluence of the surface of the copper layer on the front side: 78 J/cm$^2$
Spot diameter at the condensing point: 5 μm
Fluence at the condensing point: 300 J/cm$^2$
Scanning speed: 200 mm/s
Scanning cycle: 30 cycles FIG. 8 is a photograph (plan view) of a substrate after pulsed laser light was applied (see FIG. 1B) along the predetermined outer edge line of the opening in 30 cycles. At a center portion of the irradiation region, a portion separated by irradiation with laser is dropped off. As illustrated in FIG. 8, in the case where the interval of the irradiation between each round at each point on the predetermined outer edge line of the opening was 247 msec, almost no burning occurred in a region around the processing portion. From the above-mentioned results, it can be said that undesirable thermal damages such as burning can be suppressed by setting the interval of the irradiation between each round at each point on the predetermined outer edge line of the opening to 5 msec or more, even in the case where pulsed laser light having a wavelength of 1064 nm is used.

The manufacturing method of a processed resin substrate according to the embodiment of the present invention can speedily form a through hole in a resin substrate without reducing the processing quality. For example, with the manufacturing method of a processed resin substrate according to the embodiment of the present invention, speedup of the manufacturing process of a semiconductor device can be achieved.

The invention claimed is:

1. A manufacturing method of a processed resin substrate comprising:
preparing a resin substrate including a resin layer and a metal layer that covers at least a part of one surface of the resin layer; and
forming a through hole in the resin substrate by performing a plurality of laps of scanning the resin substrate with pulsed laser light along a predetermined circumference of the through hole so as to surround the through hole, the pulsed laser light including a pulse width of 10 psec to 100 nsec and a repetition frequency of 100 kHz or greater, wherein:
the forming the through hole in the resin substrate by scanning includes an interval of irradiation,
the interval of irradiation including:
an interval of the pulsed laser light at a given point along the predetermined circumference of the through hole on the resin substrate, and
an interval between irradiation with the pulsed laser light of an nth-round and irradiation with the pulsed laser light of an (n+1)th-round,
the interval of irradiation being 5 msec or more,
the given point being irradiated by a plurality of the pulsed laser light,
a scanning time of one lap of the predetermined circumference with the pulsed laser light is less than 5 msec, and
irradiation of the pulsed laser light is intermittently stopped such that an interval of irradiation of the pulsed laser light at each point on the predetermined circumference between each lap is 5 msec or more.

2. The method according to claim 1, wherein the metal layer covers both surfaces of the resin layer in part or in whole.

3. The method according to claim 1, wherein the forming the through hole in the resin substrate further includes applying the pulsed laser light to the resin substrate from a side on which the metal layer is disposed.

4. The method according to claim 1, wherein:
a wavelength of the pulsed laser light is 250 to 2000 nm; and
an output of the pulsed laser light is 10 W or greater.

5. The method according to claim 1, wherein:
the forming the through hole in the resin substrate further includes a condensing point of the pulsed laser light located in the resin layer;
a wavelength of the pulsed laser light is 355 nm;
a pulse energy of the pulsed laser light is 3 μJ or greater;
a fluence of the pulsed laser light on the surface of the resin substrate is 3 J/cm$^2$ or greater; and
a fluence of the pulsed laser light at the condensing point is 10 J/cm$^2$ or greater.

6. The method according to claim 1, wherein the resin layer is composed of one or more resins selected from a group consisting of epoxy resin, polyimide resin, polyethylene terephthalate resin, polyethylene naphthalate resin, bismaleimide triazine resin, phenol resin, silicone resin, modified silicone resin and epoxy modified silicone resin.

7. The method according to claim 1, wherein the resin layer includes one or more reinforcements selected from a group consisting of a glass fiber, ceramics, a ceramics fiber, paper, cloth, a carbon fiber and an aramid fiber.

8. The method according to claim 1, wherein the resin layer is a glass epoxy substrate or a polycarbonate substrate.

9. The method according to claim 1, wherein the metal layer is composed of one or more metals selected from a group consisting of copper, silver, gold and aluminum, or an alloy which contains any of the metals as a main component.

10. The method according to claim 1, wherein a thickness of the metal layer is 2 to 50 μm.

11. The method according to claim 1, wherein:
   a scanning speed of the pulsed laser light is 200 mm/sec or more; and
   an output of the pulsed laser light is 10 W or greater.

12. The method according to claim 1, wherein the interval of irradiation of the pulsed laser light at each point on the resin substrate is 152.9 msec or less.

* * * * *